US012204422B2

(12) United States Patent
Tong et al.

(10) Patent No.: US 12,204,422 B2
(45) Date of Patent: Jan. 21, 2025

(54) MULTIPLE PLANE PROGRAMMING WITH QUICK PLANE PROGRAMMING TERMINATION AND LAGGING PLANE BOOSTING

(71) Applicant: Micron Technology, Inc., Boise, ID (US)

(72) Inventors: Lu Tong, Woodlands (SG); Ashish Ghai, Saratoga, CA (US); Chai Chuan Yao, Woodlands (SG); Ekamdeep Singh, San Jose, CA (US); Lakshmi Kalpana Vakati, San Jose, CA (US); Sheng Huang Lee, Meridian, ID (US); Matthew Ivan Warren, Meridian, ID (US); Dheeraj Srinivasan, San Jose, CA (US); Jeffrey Ming-Hung Tsai, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 18/143,937

(22) Filed: May 5, 2023

(65) Prior Publication Data

US 2023/0367680 A1 Nov. 16, 2023

Related U.S. Application Data

(60) Provisional application No. 63/340,064, filed on May 10, 2022.

(51) Int. Cl.
*G06F 11/20* (2006.01)
*G06F 3/06* (2006.01)

(52) U.S. Cl.
CPC ........ *G06F 11/2023* (2013.01); *G06F 3/0617* (2013.01); *G06F 3/064* (2013.01); *G06F 3/0673* (2013.01); *G06F 2201/805* (2013.01)

(58) Field of Classification Search
CPC .... G06F 11/2023; G06F 3/0617; G06F 3/064; G06F 3/0673; G06F 2201/805;
(Continued)

(56) References Cited

U.S. PATENT DOCUMENTS

2010/0246265 A1* 9/2010 Moschiano ......... G11C 11/5635
365/185.11
2019/0198113 A1* 6/2019 Ben-Rubi .......... G11C 16/3459
2019/0318787 A1* 10/2019 Lee ........................ G11C 16/26

* cited by examiner

*Primary Examiner* — Matthew M Kim
*Assistant Examiner* — Matthew N Putaraksa
(74) *Attorney, Agent, or Firm* — Lowenstein Sandler LLP

(57) ABSTRACT

Control logic in a memory device executes a programming operation to program the set of memory blocks of the set of memory planes to a set of a programming levels. In response to determining at least a portion of a first memory block passed a program verify operation associated with a last programming level of the set of programming levels, the control logic executes a first program sub-operation to terminate the programming operation with respect to a first subset of one or more memory planes of the set of memory planes that passed the program verify operation associated with the last programming level and identify a second subset of one or more memory planes that failed the program verify operation associated with the last programming level. The control logic executes a second program sub-operation to apply a trim set to the second subset of one or more memory planes that failed the program verify operation of the last programming level.

20 Claims, 10 Drawing Sheets

(58) Field of Classification Search
CPC . G11C 16/0483; G11C 16/10; G11C 16/3459; G11C 11/5628
See application file for complete search history.

|  | 350₀ | 350₁ | 350₂ | 350₃ |
|---|---|---|---|---|
|  | Block₀ 250₀ | Block₀ 250₀ | Block₀ 250₀ | Block₀ 250₀ |
|  | Block₁ 250₁ | Block₁ 250₁ | Block₁ 250₁ | Block₁ 250₁ |
|  | Block₂ 250₂ | Block₂ 250₂ | Block₂ 250₂ | Block₂ 250₂ |
|  | Block₃ 250₃ | Block₃ 250₃ | Block₃ 250₃ | Block₃ 250₃ |
|  | Block₄ 250₄ | Block₄ 250₄ | Block₄ 250₄ | Block₄ 250₄ |
|  | ⋮ | ⋮ | ⋮ | ⋮ |
|  | Block$_{L-4}$ 250$_{L-4}$ | Block$_{L-4}$ 250$_{L-4}$ | Block$_{L-4}$ 250$_{L-4}$ | Block$_{L-4}$ 250$_{L-4}$ |
|  | Block$_{L-3}$ 250$_{L-3}$ | Block$_{L-3}$ 250$_{L-3}$ | Block$_{L-3}$ 250$_{L-3}$ | Block$_{L-3}$ 250$_{L-3}$ |
|  | Block$_{L-2}$ 250$_{L-2}$ | Block$_{L-2}$ 250$_{L-2}$ | Block$_{L-2}$ 250$_{L-2}$ | Block$_{L-2}$ 250$_{L-2}$ |
|  | Block$_{L-1}$ 250$_{L-1}$ | Block$_{L-1}$ 250$_{L-1}$ | Block$_{L-1}$ 250$_{L-1}$ | Block$_{L-1}$ 250$_{L-1}$ |
|  | Block$_L$ 250$_L$ | Block$_L$ 250$_L$ | Block$_L$ 250$_L$ | Block$_L$ 250$_L$ |
|  | 240₀ | 240₁ | 240₂ | 240₃ |

FIG. 3

MULTIPLE PLANE PROGRAMMING WITH QUICK PLANE PROGRAMMING TERMINATION AND LAGGING PLANE BOOSTING

CROSS-REFERENCE TO RELATED APPLICATION

This application claims the benefit of U.S. Provisional Application No. 63/340,064, titled "Multiple Plane Programming with Quick Plane Programming Termination and Lagging Plane Boosting," filed May 10, 2022, which is hereby incorporated herein by reference in its entirety.

TECHNICAL FIELD

Embodiments of the disclosure relate generally to memory sub-systems, and more specifically, relate to a multiple plane programming operation including terminating programming of one or more quick planes and boosting one or more lagging memory planes.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a block schematic of a portion of an array of memory cells as could be used in a memory of the type described with reference to FIG. 1B according to an embodiment.

DETAILED DESCRIPTION

Figure 1A:
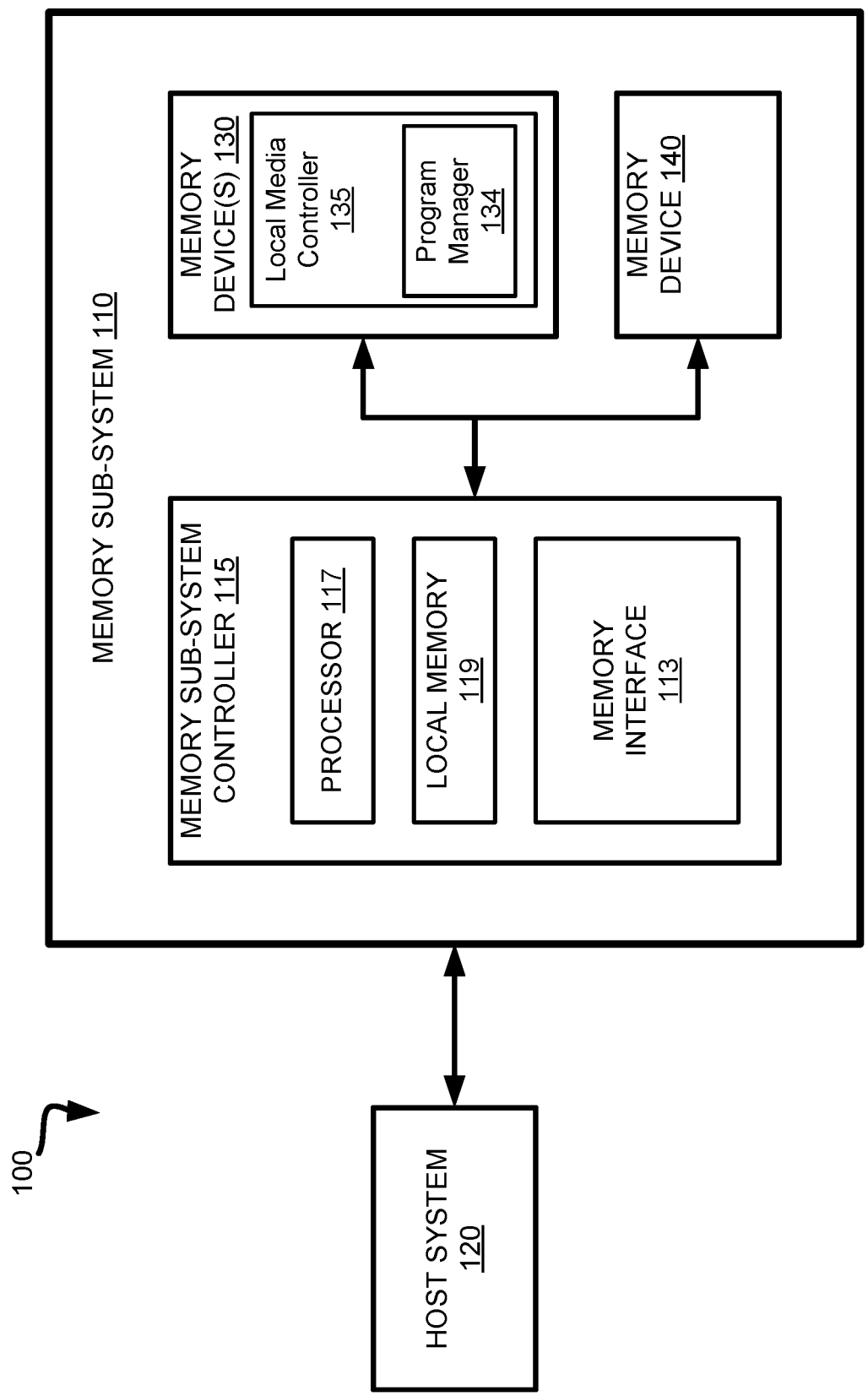
FIG. 1A illustrates an example computing system that includes a memory sub-system in accordance with some embodiments.

Aspects of the present disclosure are directed to programming of a memory device in a memory sub-system using a multiple plane programming operation including terminating programming of one or more quick planes and boosting one or more lagging memory planes. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1A. A non-volatile memory device is a package of one or more memory dies. Each memory die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Memory cells are formed onto a silicon wafer in an array of columns connected by conductive lines (also referred to as bitlines) and rows connected by conductive lines (also referred to as wordlines). A wordline can refer to a conductive line that connects control gates of a set (e.g., a row) of memory cells of a memory device that are used with one or more bitlines to generate the address of each of the memory cells. The intersection of a bitline and wordline constitutes the address of the memory cell.

A block hereinafter refers to a unit of the memory device used to store data and can include a group of memory cells, a wordline group, a wordline, or individual memory cells. Each block can include a number of sub-blocks, where each sub-block is defined by an associated pillar (e.g., a vertical conductive trace) extending from a shared bitline. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of poly-silicon channel material (i.e., a channel region). The memory cells can be coupled to access lines (i.e., wordlines) often fabricated in common with the memory cells, so as to form an array of strings in a block of memory (e.g., a memory array). The compact nature of certain non-volatile memory devices, such as 3D flash NAND memory, means wordlines are common to many memory cells within a block of memory. Some memory devices use certain types of memory cells, such as triple-level cell (TLC) memory cells, which store three bits of data in each memory cell, which make it affordable to move more applications from legacy hard disk drives to newer memory sub-systems, such as NAND solid-state drives (SSDs).

A memory sub-system can have a multi-plane memory die (e.g., N planes) including multiple blocks of memory cells arranged in multiple planes (e.g., a multi-plane memory device) for which multi-plane parity protection can be employed. Each block can be divided into multiple sub-blocks that each include multiple pages (e.g., three pages per sub-block).

Memory access operations (e.g., a program operation, an erase operation, etc.) can be executed with respect to the memory cells by applying a wordline bias voltage to wordlines to which memory cells of a selected page are connected. For example, during a programming operation, one or more selected memory cells can be programmed with the application of a program voltage to a selected wordline. In one approach, an Incremental Step Pulse Programming (ISPP) process or scheme can be employed to maintain a tight cell threshold voltage distribution for higher data reliability. In ISPP, a series of high-amplitude pulses of voltage levels having an increasing magnitude (e.g., where the magnitude of subsequent pulses are increased by a predefined pulse step height) are applied to wordlines to which one or more memory cells are connected to gradually raise the voltage level of the memory cells to above a wordline voltage level corresponding to the memory access operation (e.g., a target program level). The application of the uniformly increasing pulses by a wordline driver of the memory device enables the selected wordline to be ramped or increased to a wordline voltage level ($V_{wl}$) corresponding to a memory access operation. Similarly, a series of voltage pulses having a uniformly increasing voltage level can be applied to the wordline to ramp the wordline to the corresponding wordline voltage level during the execution of an erase operation.

Memory cells in a NAND array architecture can be configured, e.g., programmed, to a desired state. That is, electric charge can be placed on or removed from the floating gate of a memory cell to put the cell into a number of stored states. For example, a single level cell (SLC) can represent two binary states, e.g., 1 or 0. Flash memory cells can also store more than two binary states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). The state of a memory cell, e.g., the data stored in the cell, is determined by the threshold voltage (Vt).

In MLCs, it is important that the Vt distributions be sufficiently spaced apart so as to reduce the possibility of a higher voltage of one distribution overlapping a lower Vt of the next distribution. The overlap can occur due to factors such as noise, floating gate coupling, or temperature variations of the integrated circuit, among various other factors. One way to create larger gaps between the various Vt distributions is to make the distributions themselves narrower. This can be difficult because memory cells program at different rates, e.g., Vts increase at varying rates, due to factors such as manufacturing process variations and/or repeated programming and erasing, among other factors.

A fast or quick cell can have a higher threshold voltage than a slow or lagging cell, for a given programming period. Therefore, faster memory cells may be programmed before the slower cells since the faster cells can require fewer programming pulses. This can result in the Vt distribution for the faster cells being different than the Vt distribution for slower cells and/or closer to other Vt distributions due to the wider Vt distributions that can be created by faster cells. Furthermore, in a multi-plane programming operation, In certain memory devices, when a unit of data is written that is larger than the typical block size (i.e., includes multiple blocks worth of data), those multiple blocks can be programmed in a stripe across multiple planes of the memory device. Such a program operation (i.e., a program operation that exceeds the size of a single block) can be referred to as a multi-plane programming operation. Thus, any time a larger segment of data is programmed to the memory device as part of a multi-plane programming operation, all of the planes of the memory device, or at least multiple planes, will be inaccessible for the duration of the program operation.

It may be the case that the memory device can include one or more defects. Examples of defects can include shorts (e.g., wordline shorts, bitline shorts). A defect can result in failure during a memory device operation, such as an erase operation, a program operation or a read operation. However, some defects may be undetectable at the time of manufacturer, or the defects may develop over time during the operating life of the memory device. Moreover, some early-stage defects may not be detected during certain erase operation (e.g., during erase verify), but can lead to failure during the following program operation or read operation. Accordingly, erase operations performed on defective memory devices may not result in erase failure.

Fabrication issues associated with the memory device can result in wordline-related failures. For example, a wordline-to-pillar defect caused during fabrication can result in wordline-to-pillar short induced program and read failures and associated loss in reliability of a memory device. For example, wordline-to-pillar shorts can account for approximately 30% of a raw defective parts per million (DPM) metric or other indicator of memory device reliability. Wordline-to-pillar shorts can be caused by a variety different defects in the manufacturing process of the memory device. For example, the wordline-to-pillar short can be caused by issues in the wordline deposition process resulting in a tungsten tier void, a blocked etching, a pin hole, etc.

However, most of the wordline-to-pillar short defects are only detectable following several program/erase cycles during end-user usage of the memory device resulting in program status failures and corresponding data loss. In some scenarios, the wordline-to-pillar short defects lead to a system failure that cannot be remedied by the execution of error handling processing by a memory system controller. In certain memory devices, when data is written to a memory block, adjacent (e.g., contiguous, neighboring, nearby, next to, etc.) memory blocks can experience program disturb. Program disturb is the result of continually programming data to a particular memory block without programming and/or refreshing data stored at nearby memory blocks, causing the nearby memory blocks to change state over time (e.g., the programmed state changes). If too many programming operations are performed on the particular memory block (also referred to as an "aggressor block" or "defective block"), data stored at adjacent or proximate memory block (also referred to as a "victim block" or "non-defective block") of the memory device can become corrupted or incorrectly stored. In certain systems, a multi-plane failure (e.g., a two-plane failure, a four-plane or quad plane failure, etc.) can be caused by program disturb on non-defective memory blocks by the application of additional pulses with higher program voltages to a corresponding defective memory block. In some cases, an aggressor block with a defect (e.g., a wordline-to-pillar short defect)

Accordingly, in a multi-plane programming operation, a read failure (data loss) caused by program disturb on a non-defective block that does not have a defect can be caused by a defect located in a defective block in one of the multiple planes. Since the defective block and the non-defective block are programmed together as a part of a multi-plane programming operation, the non-defective block experiences read failures and data loss due to the defect in the defective block.

According to aspects of the present disclosure, a multi-plane programming operation or algorithm is executed to detect, isolate, and reduce failures (e.g., multi-plane program and read failures) induced by a wordline-related failure (e.g., a failure due to a wordline-to-pillar short defect, a failure due to a wordline-to-wordline short defect, etc.) in a multi-plane memory device. The multi-plane programming operation includes a fast-to-program or quick plane termination sub-operation and a slow-to-program or lagging plane boost sub-operation to change a failure associated with the multi-plane memory device from multi-plane program and read failures to a single plane program status failure.

In an embodiment, the quick plane termination (QPT) sub-operation enables the detection of faster memory blocks of one or more memory planes (e.g., a first subset of one or more memory blocks that have passed programming faster than other memory blocks being programmed) and the termination of further programming of the first subset of faster memory blocks to avoid undesirable program disturb effects induced by a wordline-related defect. In an embodiment, the QPT sub-operation includes a failed programming count determination to identify a number or count of memory cells (or bytes) that have not yet passed programming, compare the identified failed programming count to a threshold level, and determine whether the programming passed (e.g., the failed programming count is less than the threshold level) or the programming failed (e.g., the failed byte count is greater than or equal to the threshold level). In an embodiment, to avoid a programming time penalty, the check failed programming count sub-operation is performed in parallel with a program pulse. In an embodiment, while the program pulse is being applied, the check failed programming count sub-operation is executed as part of the quick plane termination sub-operation.

In an embodiment, the lagging plane boost sub-operation to detect a lagging plane (e.g., a memory plane that has not yet passed programming) and applying an updated or new program setting (e.g., application of a different trim set) to the one or more lagging memory blocks (i.e., a "bad" or potentially defective memory block). In an embodiment, the trim set can include one or more values relating to one or more parameters of the memory device that can be adjusted or tuned to modify the behavior and characteristics of the memory device.

Advantageously, the updated program setting can be applied to the identified lagging memory blocks, without impacting other non-defective or "good" memory blocks during the multi-plane programming operation. Instead of a program and read failure resulting from a typical programming operation, the lagging boost sub-operation of the multi-plane programming operation results in a program status failure only, and no further data loss associated with the defective block. a relaxed program loop limit setting, a maximum program voltage level setting, a program pulse width setting, a program verify criteria setting, a selective slow program convergence setting, etc.

Accordingly, the multi-plane programming operation including the quick plane termination sub-operation and the lagging plane boost sub-operation eliminates multi-plane program and read failures associated with wordline-related failures in a typical system, and instead transforms the wordline-related failure into a single plane program status failure, without increasing an overall programming time (e.g., without a programming time penalty). Furthermore, the multi-plane programming operation according to embodiments of the present application isolate and protect the non-defective memory blocks from the defective memory blocks. The isolation of the non-defective memory blocks enables the application of updated program settings to the defective blocks, without negatively impacting the non-defective blocks. In addition, the multi-plane programming operation results in the mitigation of slow-to-program failures due to data loss.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory device(s) 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include not-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory device(s) 130 can be grouped as pages that can refer to a logical unit of the memory device used to store data. With some types of memory (e.g., NAND), pages can be grouped to form blocks. In one embodiment, the term "MLC memory" can be used to represent any type of memory cell that stores more than one bit per cell (e.g., 2 bits, 3 bits, 4 bits, or 5 bits per cell).

Although non-volatile memory components such as 3D cross-point array of non-volatile memory cells and NAND type flash memory (e.g., 2D NAND, 3D NAND) are described, the memory device(s) 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, and electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory device(s) 130 include local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device(s) 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device(s) 130 includes a program manager 134 configured to carry out corresponding memory access operations, in response to receiving the memory access commands from memory interface 113. In some embodiments, local media controller 135 includes at least a portion of the program manager 134 and is configured to perform the functionality described herein. In some embodiments, program manager 134 is implemented on memory device 130 using firmware, hardware components, or a combination of the above. In one embodiment, the program manager 134 receives, from a requestor, such as memory interface 113, a request to program data associated with a set of memory blocks including memory cells of a memory array of memory device(s) 130, where the memory blocks being programmed are located in different memory planes. In an embodiment, the program manager 134 executes a multi-plane programming operation including a first sub-operation (i.e., a QPT sub-operation) and a second sub-operation (i.e., a lagging plane boost sub-operation). In an embodiment, once any of the memory blocks being programmed have at least a portion of the memory cells with a Vt reaching a final program verify level associated with a last or final programming level of the a set of programming levels (also referred to as a "QPT threshold level"), the quick plane termination (QPT) sub-operation is executed. The QPT sub-operation is executed to identify one or more fast-to-program or "quick" memory planes in the set of memory planes being programmed.

In an embodiment, the QPT sub-operation is initiated in response to a memory plane reaching the last program verify level. The program manager 134 executes the QPT sub-operation to identify a set of one or more memory planes that passed programming (i.e., a set of quick memory planes) and a set of one or more memory planes that failed programming (i.e., a set of lagging memory planes). In an embodiment, the program manager 134 terminates programming of the set of memory planes that passed programming. In an embodiment, the program manager 134 executes a lagging plane boost sub-operation to apply a selected trim set to the set of one or more lagging memory planes. In an embodiment, the trim set can include one or more values relating to one or more parameters of the memory device that can be adjusted or tuned to modify the behavior and characteristics of the memory device. For example, the trim set or trim values can specify different parameters relating to the programming of the memory device, such as the voltage pulse shapes (e.g., pulse magnitude, pulses width, etc.), intensity, duration, write-to write delay, a relaxed program loop limit setting, a program verify criteria setting, a selective slow program convergence setting, etc.

Figure 1B:
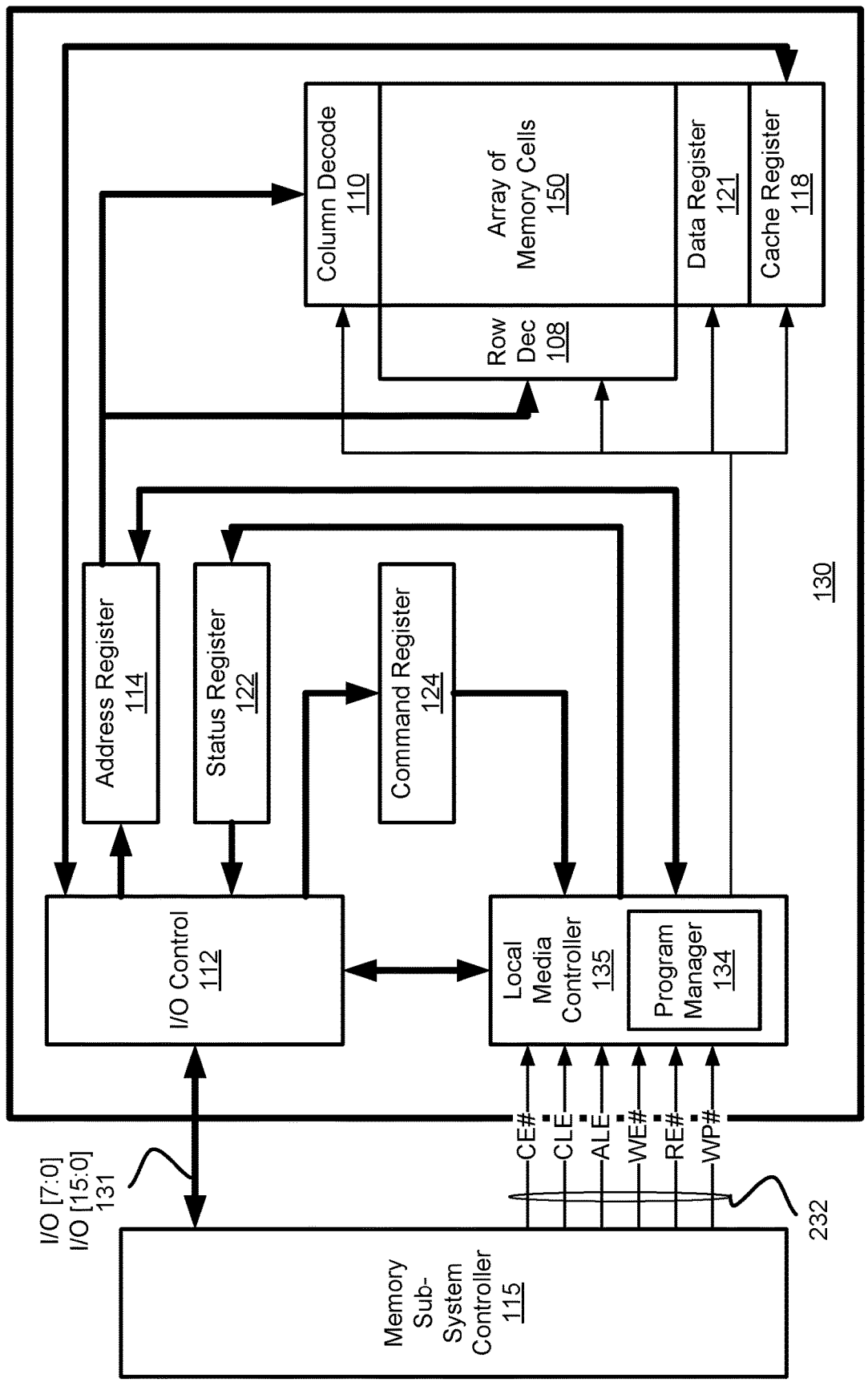
FIG. 1B is a block diagram of memory device(s) in communication with a memory sub-system controller of a memory sub-system according to an embodiment.

FIG. 1B is a simplified block diagram of a first apparatus, in the form of a memory device(s) 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device(s) 130), may be a memory controller or other external host device.

Memory device 130 includes an array of memory cells 150 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 250 are capable of being programmed to one of at least two target data states.

Row decode circuitry 108 and column decode circuitry 110 are provided to decode address signals. Address signals are received and decoded to access the array of memory cells 150. Memory device(s) 130 also includes input/output (I/O) control circuitry 112 to manage input of commands, addresses and data to the memory device(s) 130 as well as output of data and status information from the memory device 130. An address register 114 is in communication with I/O control circuitry 212 and row decode circuitry 108 and column decode circuitry 110 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 110 to control the row decode circuitry 108 and column decode circuitry 110 in response to the addresses. In one embodiment, local media controller 135 includes the program manager 134, which can implement the multi-plane program operation including execution of a QPT sub-operation and a lagging plane boost sub-operation to identify and isolate non-defective memory blocks and one or more defective blocks of memory device(s) 130, as described herein.

The local media controller 135 is also in communication with a cache register 118. Cache register 118 latches data, either incoming or outgoing, as directed by the local media controller 135 to temporarily store data while the array of memory cells 150 is busy writing or reading, respectively, other data. During a program operation (e.g., write operation), data may be passed from the cache register 118 to the data register 121 for transfer to the array of memory cells 150; then new data may be latched in the cache register 118 from the I/O control circuitry 212. During a read operation, data may be passed from the cache register 118 to the I/O control circuitry 112 for output to the memory sub-system controller 115; then new data may be passed from the data register 121 to the cache register 118. The cache register 118 and/or the data register 121 may form (e.g., may form a portion of) a page buffer of the memory device(s) 130. A page buffer may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local memory controller 135 to latch the status information for output to the memory sub-system controller 115.

Memory device(s) 130 receives control signals at the memory sub-system controller 115 from the local media controller 135 over a control link 132. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) may be further received over control link 132 depending upon the nature of the memory device(s) 130. In one embodiment, memory device 130 receives command signals (which represent commands), address signals (which represent addresses), and data signals (which represent data) from the memory sub-system controller 115 over a multiplexed input/output (I/O) bus 131 and outputs data to the memory sub-system controller 115 over I/O bus 131.

For example, the commands may be received over input/output (I/O) pins [7:0] of I/O bus 131 at I/O control circuitry 112 and may then be written into command register 124. The addresses may be received over input/output (I/O) pins [7:0] of I/O bus 234 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 121 for programming the array of memory cells 150.

In an embodiment, cache register 118 may be omitted, and the data may be written directly into data register 121. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the example memory device 130 of FIG. 1B has been simplified.

It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
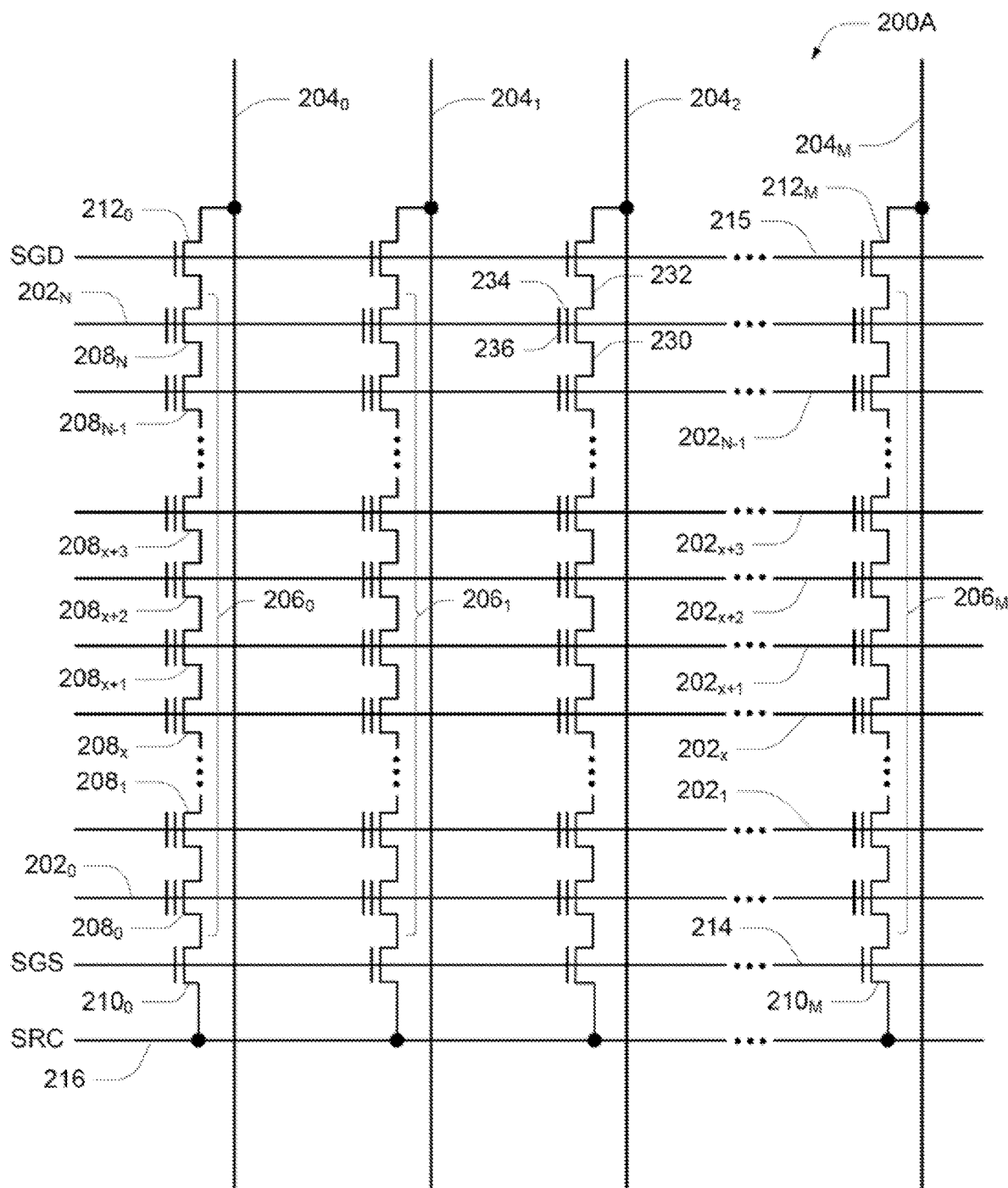
FIG. 2A-2C are schematics of portions of an array of memory cells as could be used in a memory of the type described with reference to FIG. 1B according to an embodiment.
Figure 2B:
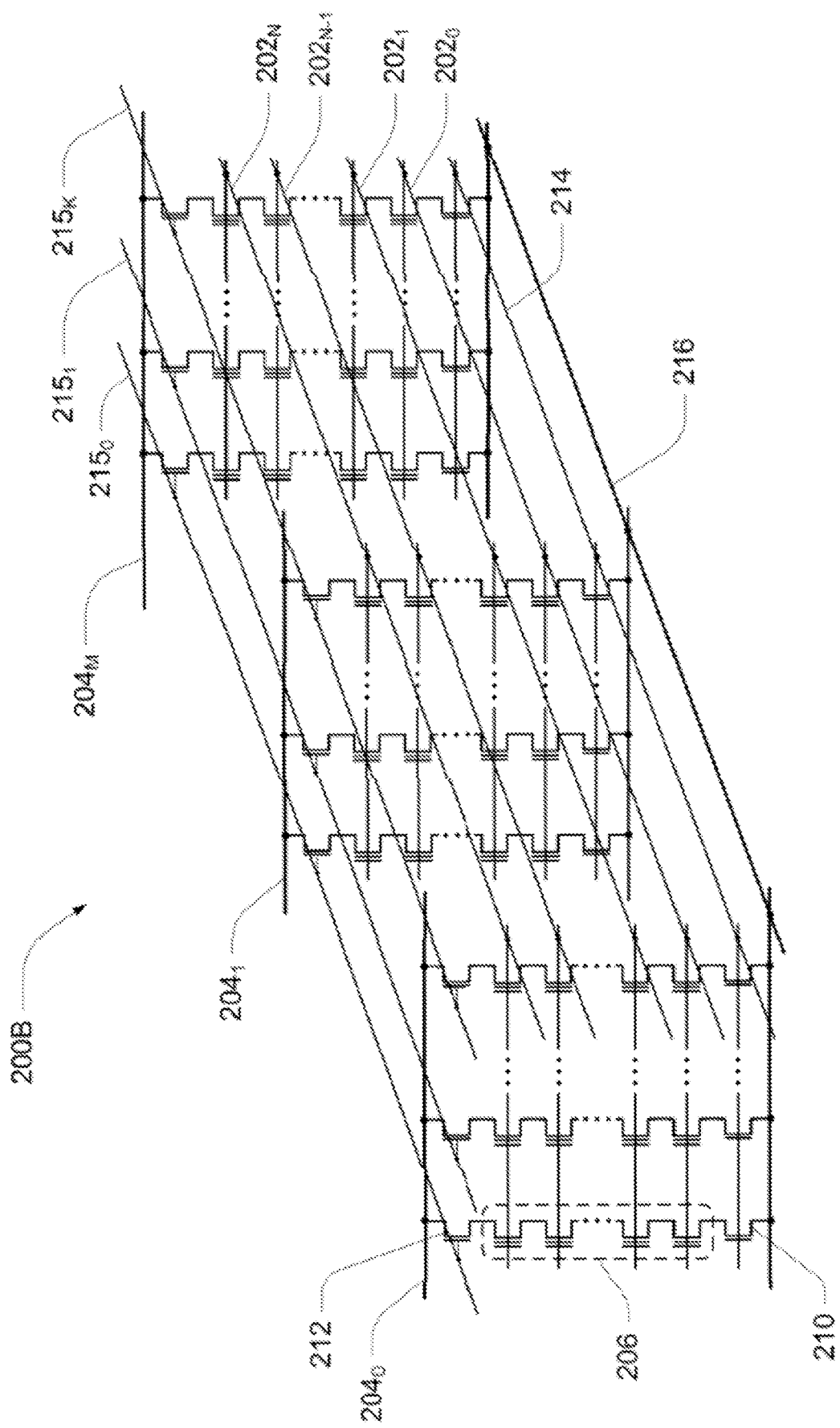
Figure 2C:
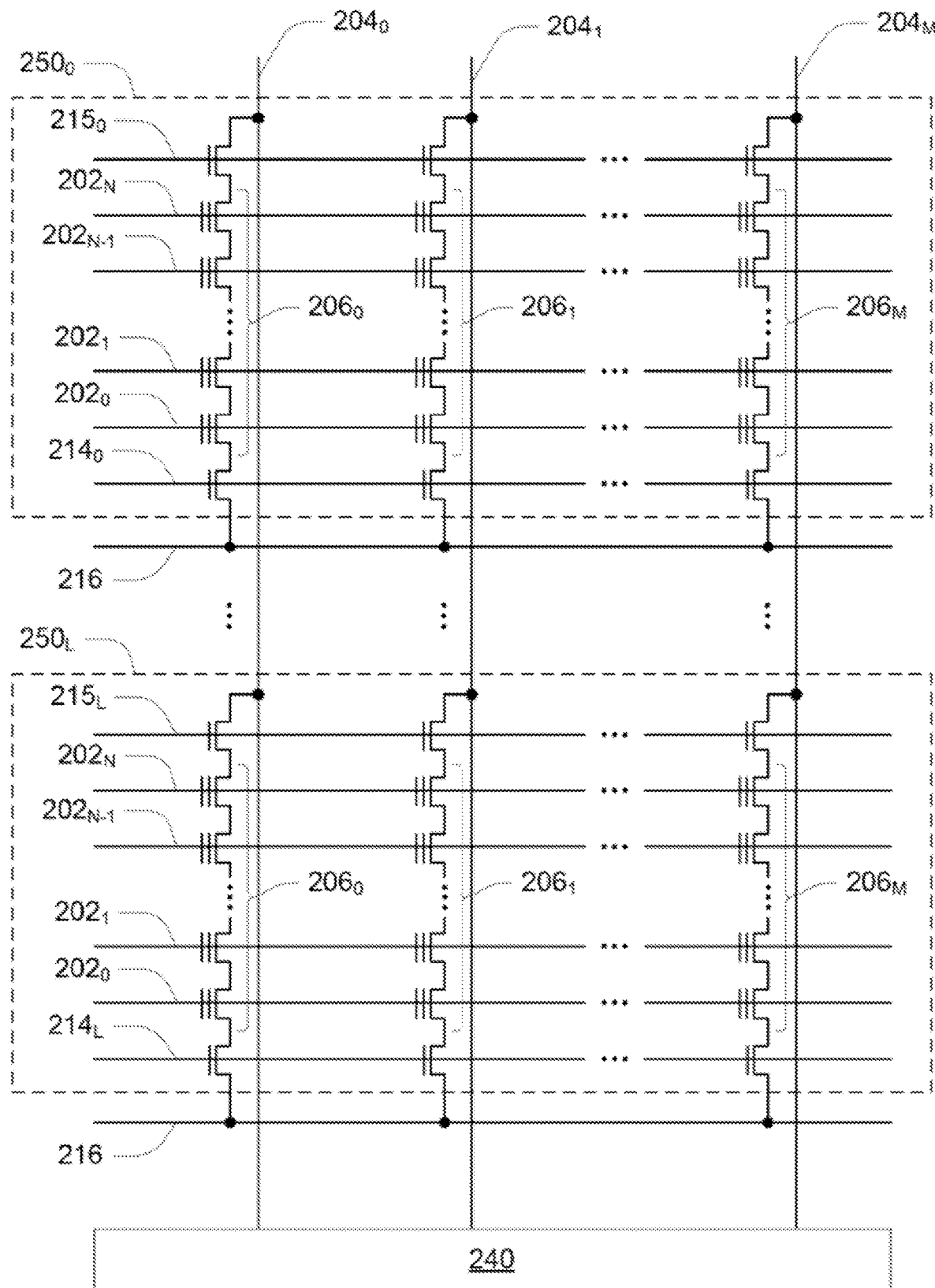

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $202_0$ to $202_N$, and data lines, such as bitlines $204_0$ to $204_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_O$ can be connected to memory cell $208_N$ of the corresponding NAND string $206o$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap layer, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each wordline 202 can be connected to multiple rows of memory cells of the memory array 200B. Rows of memory cells that are commonly connected to each other by a particular wordline 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
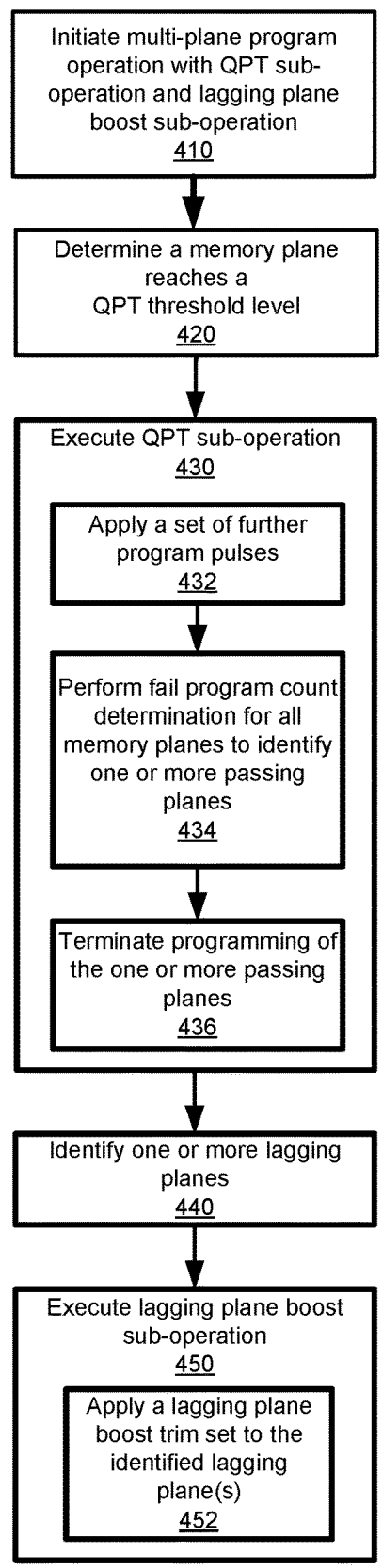
FIG. 4 illustrates an example process flow relating to a multi-plane programming operation executed to program a set of memory blocks associated with a set of multiple planes to a programming level of a set of programming levels.

FIG. 4 illustrates an example process flow 400 relating to a multi-plane programming operation executed to program a set of memory blocks associated with a set of multiple planes (e.g., plane 0, plane 1, plane 2 . . . plane N) to a programming level of a set of programming levels (e.g., programming levels L1 to L15 for a QLC memory cell, where L0 represents an erase level). At operation 410, the multi-plane programming operation including a quick plane termination (QPT) sub-operation and a lagging plane boost sub-operation is initiated. In an embodiment, the multi-plane programming operation includes a series of programming pulses and program verify operations that are applied to program each programming level (e.g., programming levels L1 to L15 for a QLC memory cell) in sequence. For example, the multi-plane programming operation is executed to sequentially program the levels of the memory block (e.g., L1 to L15) by applying a first set of program pulses to program level L1 to a first target voltage level, followed by the application of a second set of program pulses to program level L2 to a second target voltage level, and so on until all of the levels are programmed. A respective program verify operation is executed for each programming level to determine if programming has passed (e.g., programming is verified) the respective programming level.

At operation 420, a determination is made that one of the memory blocks of one of the memory planes has a threshold voltage (Vt) that reached or "touched" a last or final program verify level (also referred to as a "QPT threshold level"). In an embodiment, the QPT threshold level is a program verify level associated with a last programming level of the set of programming levels. For example, for a TLC memory block, the QPT threshold level is the L7 program verify level. In another example, for a QLC memory block, the QPT threshold level is the L15 program verify level.

At operation 430, in response to the Vt corresponding to at least a portion of one of a memory block reaching the QPT threshold level (i.e., the last or final program verify level) execution of a QPT sub-operation is initiated. The QPT sub-operation is performed to detect and identify one or more memory blocks of the set of memory blocks being programmed that have passed programming (e.g., the one or more memory blocks that have passed the last program verify level). In an embodiment, the QPT sub-operation enables the identification of one or more "good" or non-defective memory planes that can be isolated from one or more "bad" or defective memory planes.

At operation 432, a set of programming pulses is applied to the wordlines corresponding to the memory blocks being programmed. Application of the set of programming pulses enables the non-defective memory blocks to complete programming of the last programming level. In an embodiment, the set of programming pulses can include a predefined number of pulses (e.g., two programming pulses, three programming pulses, four programming pulses, etc.).

At operation 434, following the set of programming pulses, in an embodiment, the QPT sub-operation includes the execution of a check to determine whether a number or count of memory elements (e.g., bits, bytes, cells, etc.) that failed to pass programming (also referred to as a "failed programming count") for each of the memory blocks being programmed satisfies a first condition (or passing condition) or a second condition (or failing condition). In an embodiment, a failed programming count for each of the respective memory blocks being programmed is compared to a threshold count level. In an embodiment, a determination is made that a first condition is satisfied where programming has passed for the corresponding memory plane if the failed programming count is less than the threshold level. In an embodiment, a determination is made that a second condition is satisfied where the programming has failed if the failed programming count is greater than or equal to the threshold level). In an embodiment, to avoid a programming time penalty, the QPT sub-operation and associated failed programming count determination relating to the last program verify level is performed in parallel with or during the application of one or more programming pulses as part of the multi-plane programming operation. In an embodiment, the failed programming count determination is performed during a program pulse flattop, in parallel with memory cell programming, to avoid an additional programming time penalty.

As a result of operation 434, a set of one or more memory blocks that have passed programming (e.g., memory blocks having a failed programming count that is less than the threshold level) are identified. In an embodiment, the one or more memory blocks and corresponding memory planes that are identified as passing programming are identified as fast-to-program or quick memory planes. In an embodiment, the QPT sub-operation enables the identification and isolation of the one or more quick memory planes from the one or more slow or lagging memory planes.

Upon detection and isolation of the one or more quick planes by the QPT sub-operation, at operation 436, programming is terminated for the set of one or more passing memory blocks and corresponding memory planes. In an embodiment, termination of the multi-plane programming operation with respect to the quick planes results in no further programming pulses being applied to those memory blocks (e.g., termination voltage to a wordline associated with a memory block of the identified memory plane). In a conventional system, a program verify operation is performed with respect to only a lowest programming level that has not yet been reached. Advantageously, in an embodiment, the fail count determination of the QPT sub-operation is performed with respect to the final or last program verify level, as described herein.

In an embodiment, the one or more passing memory blocks can be shut off by disabling selection of the corresponding memory plane. Once the memory plane is disabled, the corresponding memory block is isolated, since no voltage passes to the local or associated wordline. Advantageously, the QPT sub-operation enables the de-coupling of the non-defective blocks from the defective blocks, such that programming of the non-defective blocks (e.g., the memory blocks that have passed programming) can be terminated. This further limits the effects on the non-defective blocks that can be caused by program disturb associated with the one or more defective blocks.

In an embodiment, execution of the QPT sub-operation further enables the identification of one or more lagging memory blocks. At operation 440, the one or more lagging memory planes are identified. In an embodiment, a lagging memory block can be identified by determining that its failed programming count is greater than or equal to the threshold level. In an embodiment, when the failed programming count is greater than or equal to the threshold level, a determination is made that the memory block and corresponding memory plane is lagging and failing to program due to a defect with the memory plane. In an embodiment, once a single lagging memory plane is identified while all other memory blocks and corresponding memory planes have passed QPT detection and have had programming terminated, that lagging plane may be identified as having a defect.

At operation 450, in view of the identification of one or more lagging memory blocks and corresponding memory planes, execution of a lagging plane boost sub-operation is initiated. In an embodiment, the identified lagging memory plane can be marked by setting a flag in a status register to indicate that the identified memory plane has not yet completed programming and is lagging, as compared to the identified one or more passing memory planes. The lagging plane boost sub-operation enables the application of a set of one or more programming parameters (also referred to as a "lagging plane boost trim set") to the one or more lagging memory planes, in operation 452. In an embodiment, the lagging plane boost trim set can be applied to enhance the programming strength with respect to the lagging memory plane to enable the programming of the lagging memory plane to complete. In an embodiment, a particular lagging plane boost trim set can be selected from a set of different predefined lagging plane boost trim sets which each correspond to a desired outcome with respect to the lagging plane. In an embodiment, the lagging plane boost trim set can be selected to enable a particular action with respect to the lagging plane, such as marking the lagging plane, terminating or killing the lagging plane, continuing programming of the lagging plane, etc. In an embodiment, the lagging plane boost trim set can include one or more parameters or settings such as a relaxed program loop limit setting, a maximum program voltage level setting, a program pulse width setting, a program verify criteria setting, a selective slow program convergence setting, etc.

In an embodiment, a previously lagging plane that marginally passes as a result of the application of the lagging plane boost trim set, a program status failure can be forced (e.g., the or the memory block can be downgraded to indicate programming has failed). Advantageously, the detection and diagnosis of the lagging plane can enable the turning of a program and read failure into a program status failure only, which eliminates further data loss with respect to the defective memory block.

Figure 5:
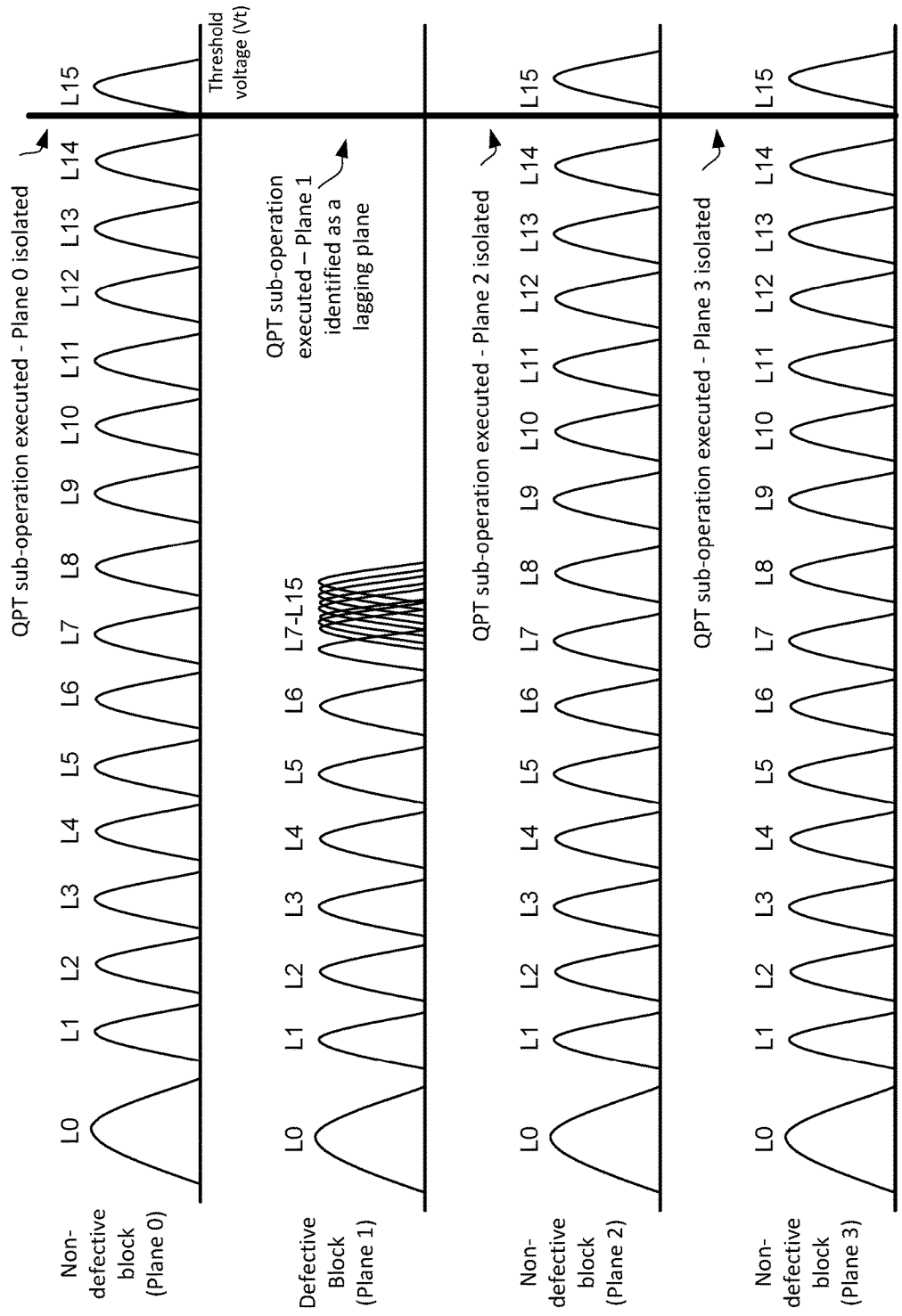
FIG. 5 illustrates example programming distributions associated with execution of a multi-plane programming operation including a QPT sub-operation and lagging plane boost sub-operation to program a set of memory blocks associated with a set of multiple memory planes of an example memory device.

FIG. 5 illustrates execution of a multi-plane programming operation including a QPT sub-operation and lagging plane boost sub-operation to program a set of memory blocks associated with a set of multiple memory planes (e.g., Plane 0, Plane 1, Plane 2, and Plane 3). As illustrated, the example multi-plane programming operation is executed on four memory blocks located in four different memory planes (e.g., a first memory block in Plane 0, a second memory block in Plane 1, a third memory block in plane 2, and a fourth memory block in Plane 3). As shown in FIG. 5, the multi-plane programming operation is executed to establish an example set of programming distributions of memory cells of a set of memory blocks of different memory planes (Plane 0, Plane 1, Plane 2, and Plane 3) programmed to the respective programming levels (e.g., L1 to L15, where L0 is an erase level). As part of the multi-plane programming operation, following the application of the one or more program pulses associated with each program level, a program verify operation is performed to determine if a threshold voltage (Vt) corresponding to a memory cell in the memory block has passed programming (e.g., the memory cell Vt has reached a target voltage level associated with a respective programming level) or failed programming (e.g., the memory cell Vt has not reached the target voltage level associated with the respective programming level).

As shown in FIG. 5, when one of the memory blocks (e.g., the memory block of Plane 0) has at least a portion of memory cells with a Vt that has reached the last program verify level (e.g., the program verify level associated with L15), the QPT sub-operation is executed. The QPT sub-operation includes the application of a set of further programming pulses to enable one or more of the memory blocks to complete programming. Following the application of the set of further programming pulses, a fail program count determination is performed. The fail program count determination includes a comparison of a count or number of failed memory elements (e.g., bits, bytes, cells, etc.) associated with each of the memory blocks to a threshold count level to determine if programming of each respective memory block passed or failed. In the example shown, execution of the QPT sub-operation results in a determination that the memory blocks of Planes 0, 2, and 3 passed programming (i.e., the respective memory blocks have a failed program count that is less than the threshold level). Accordingly, the memory blocks in planes 0, 2, and 3 are successfully programmed, while the memory block in Plane 1 fails programming (i.e., the memory block of Plane 1 has a failed program count that is greater than or equal to the threshold level). In this example, the memory block in Plane 1 is identified as having some defect (e.g., a wordline-related defect) that prohibits that memory block from being successfully programmed. As a result of the defect, the Vt level of the memory block in Plane 1 fails to increase in response to the series of programming pules and fails to properly increase beyond a certain Vt level (e.g., the grouping of programming distributions levels L7-L15 in a particular Vt range).

In this example, based on the failed programming count determination, Plane 1 is identified as a lagging plane. Accordingly, the non-defective planes (e.g., Planes 0, 2, and 3) are isolated from the defective plane (e.g., Plane 1) during subsequent processing in accordance with the multi-plane programming operation. In the example of FIG. 5, programming of the isolated non-defective planes (Planes 0, 2, and 3) is terminated. In an embodiment, the passing blocks of Planes 0, 2, and 3 are shut off by disabling the corresponding plane selection. Once the respective plane selection for Planes 0, 2, and 3 is disabled, these passing planes are isolated since no voltage can pass to the respective wordlines.

In an embodiment, a lagging plane boost sub-operation is executed with respect to identified lagging plane (Plane 1). The lagging plane boost sub-operation includes the application of a selected set of programming parameters to the lagging plane (i.e., a lagging plane boost trim set). In an embodiment, the lagging plane boost trim set applied to Plane 1 can be selected from a set of different predefined lagging plane boost trim sets which each correspond to a desired outcome with respect to the lagging plane. In an embodiment, the lagging plane boost trim set can be selected to result in a particular action corresponding to the current programming operation. In this example, since Plane 1 is significantly lagging and not near completion of the programming operation, the lagging plane boost trim set can include parameters and setting to cause the termination of Plane 1. According to embodiments, the lagging plane boost trim set can include one or more values relating to a relaxed program loop limit setting, a maximum program voltage level setting, a program pulse width setting, a program verify criteria setting, a selective slow program convergence setting, etc.

In an embodiment, if a program status failure is identified for Plane 1, an enhanced program procedure can be applied to Plane 1 using a selected predefined trim set, since all of the non-defective or good planes are terminated and isolated. In an embodiment, for a marginally passing lagging block, a corresponding block diagnosis sub-operation (e.g., a leak detection sub-operation) can be intercepted or blocked to trigger or force a program status failure or otherwise downgrade the memory block.

Figure 6:
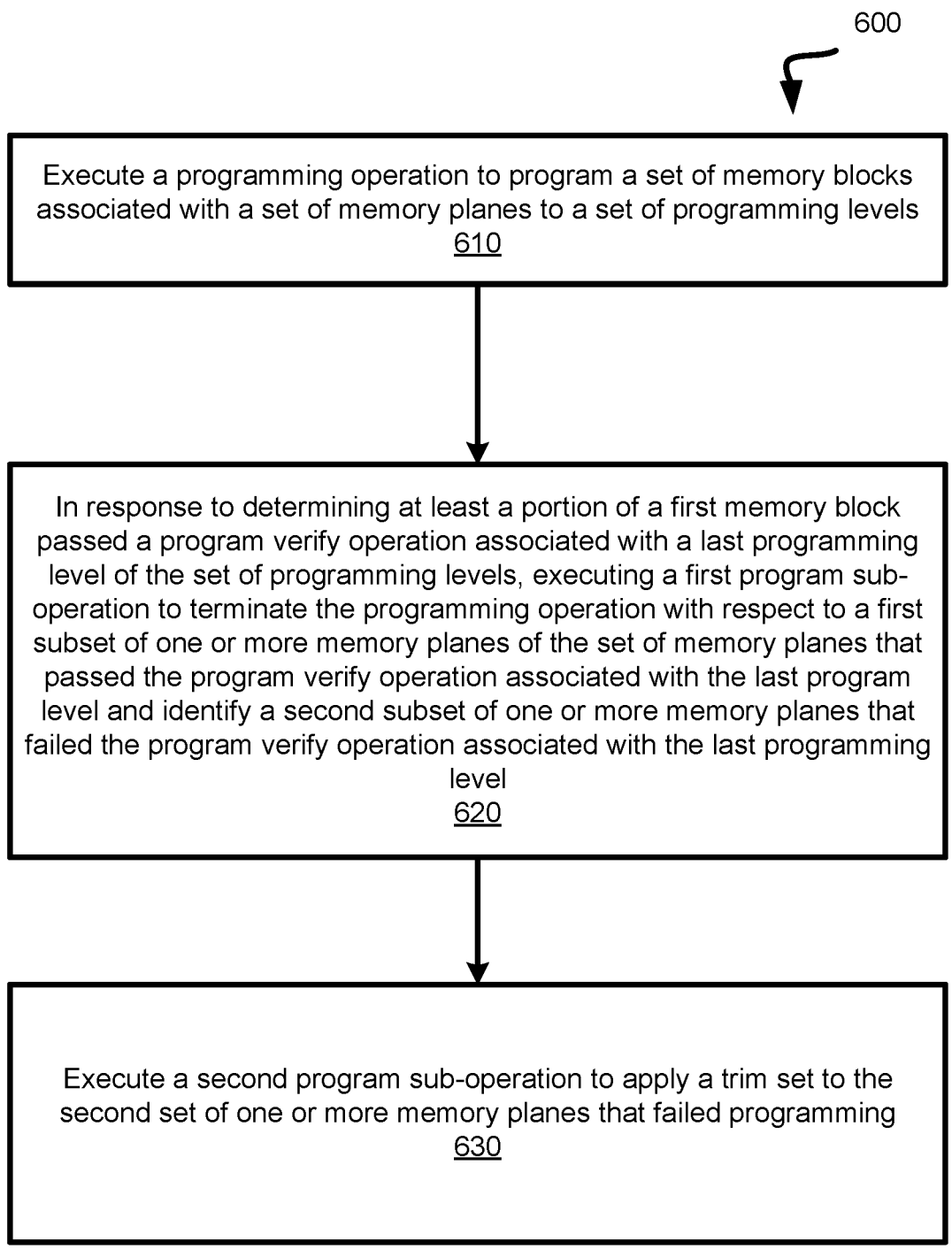
FIG. 6 is a flow diagram of an example method of a multi-plane program operation including a first program sub-operation and a second program sub-operation to program memory blocks of multiple memory planes of an example memory device, in accordance with one or more embodiments.

FIG. 6 is a flow diagram of an example method 600 of a multi-plane programming operation to program a set of memory blocks of a set of multiple memory planes in a memory sub-system in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the program manager 134 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, an operation is executed. For example, processing logic (e.g., program manager 134) executes a programming operation to program a set of memory blocks associated with a set of memory planes of a memory sub-system to a set of programming levels. In an embodiment, the programming operation (i.e., a multi-plane programming operation) is executed with respect to a set of memory blocks, where each memory block is associated with a different memory plane of the set of memory planes. The multi-plane programming operation includes the application of a series of incrementally-increasing program pulses applied to wordlines associated with the set of memory blocks being programmed to respective programming levels of the set of programming levels (e.g., levels L1 to L15 of a QLC memory device).

At operation 620, a first program sub-operation is executed. For example, in response to determining at least a portion of a first memory block passed a program verify operation associated with a last programming level of the set of programming levels, the processing logic executes a first program sub-operation to terminate the programming operation with respect to a first subset of one or more memory planes of the set of memory planes that passed the program verify operation associated with the last programming level and identify a second subset of one or more memory planes that failed the program verify operation associated with the last programming level. In an embodiment, the first program sub-operation (also referred to herein as the "QPT sub-operation") is initiated or triggered in response to a portion of one of the memory blocks of one of the memory planes satisfying or "hitting" a last program verify level corresponding to the last programming level (e.g., level L15 in a QLC memory device) of the set of memory levels.

In an embodiment, the first sub-operation includes applying a set of further programming pulses after the first memory block reaches the last program verify level. The additional programming pulses (e.g., a predefined number pulses such as two pulses, three pulses, four pulses, etc.) are applied to enable one or more of the memory blocks to complete or pass programming (e.g., satisfy or pass the last program verify level associated with the last programming level). In an embodiment, the first sub-operation further includes a determination with respect to a fail programming count associated with each of the memory blocks being programmed. In an embodiment, a count or number of memory elements (e.g., bits, bytes, cells, etc.) that failed programming (also referred to as a "failed programming count") is compared to a threshold level to determine if a first condition is satisfied indicating that the memory block passed programming (i.e., the failed programming count is less than the threshold level) or a second condition is satisfied indicating that the memory block failed programming (i.e., the failed programming count is greater than or equal to the threshold level).

In an embodiment, execution of the first sub-operation results in the identification of a first subset of one or more memory blocks that passed the program verify operation associated with the last programming level and a second subset of one or more memory blocks that failed the program verify operation associated with the last programming level. In an embodiment, the first subset of memory blocks and corresponding memory planes are identified as non-defective memory blocks and planes. In an embodiment, during the first program sub-operation, the multi-plane programming operation is terminated with respect to the first subset of memory planes that passed programming. In an embodiment, the second subset of one or more memory blocks and corresponding memory planes are identified as a lagging plane which may have a defect (e.g., a wordline-related defect). Advantageously, termination of the programming operation on the first subset of memory planes that passed programming enables those memory planes to be isolated from the one or more other defective lagging planes.

At operation 630, a second program sub-operation is executed. For example, the processing logic executes a second program sub-operation to apply a trim set (e.g., a set of values relating to parameters of the memory device) to the second subset of one or more memory planes that failed programming. In an embodiment, the processing logic executes the second program sub-operation (also referred to herein as the "lagging plane boost sub-operation") to identify and select the trim set from a set of predefined trim sets for application to the second subset of one or more memory planes. In an embodiment, the second subset of one or more memory planes (or lagging planes) are presumed to be defective and, in response, a programming action is taken to address the potential defect and lagging plane. In an embodiment, the trim set is applied to cause a desired programming action, such as forcing the lagging plane status into a failure, enhancing the programming strength associated with one or more programming pulses associated with the lagging plane, terminating or killing the lagging plane, etc. In an embodiment, the trim set can include values or settings associated with one or more of a relaxed program loop limit, a maximum program voltage, a program pulse width, program verify criteria, a SSPC setting, etc.

Figure 7:
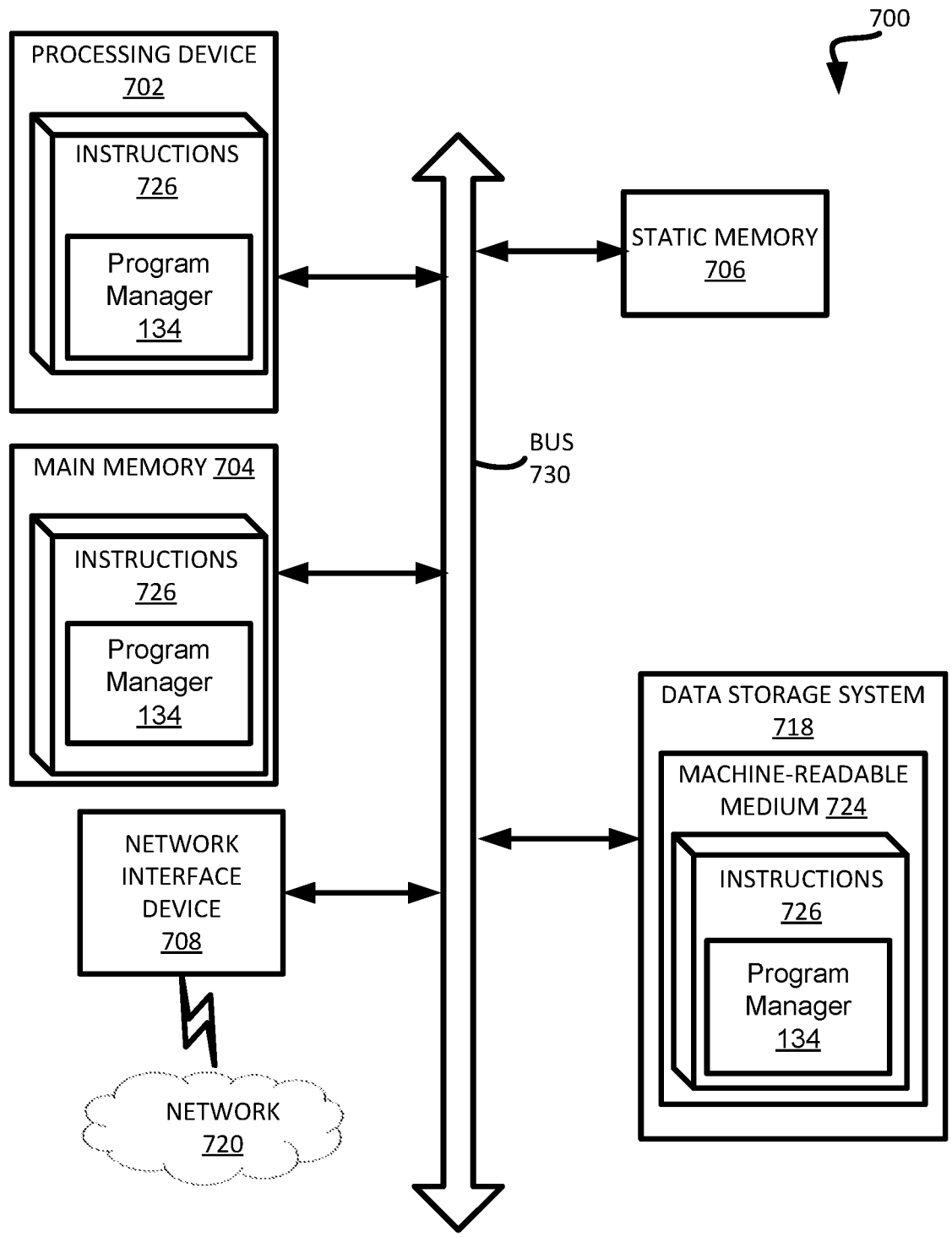
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the program manager 134 of FIGS. 1A and 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium, such as a non-transitory computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIGS. 1A and 1B.

In one embodiment, the instructions 726 include instructions to implement functionality corresponding to the program manager 134 of FIGS. 1A and 1B). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a set of memory planes comprising a set of memory blocks; and
   control logic, operatively coupled with the set of memory planes, to perform operations comprising:
   executing a programming operation to program the set of memory blocks of the set of memory planes to a set of programming levels;
   in response to determining at least a portion of a first memory block passed a program verify operation associated with a last programming level of the set of programming levels, executing a first program sub-operation to terminate the programming operation with respect to a first subset of one or more memory planes of the set of memory planes that passed the program verify operation associated with the last program level and identify a second subset of one or more memory planes that failed the program verify operation associated with the last programming level; and
   executing a second program sub-operation to apply a trim set to the second subset of one or more memory planes that failed programming.

2. The memory device of claim 1, wherein the first program sub-operation comprises causing a set of programming pulses to be applied to the set of memory blocks.

3. The memory device of claim 2, wherein following application of the set of programming pulses, the operations further comprise comparing a failed programming count corresponding to the last programming level for each of the memory planes of the set of memory planes to a threshold level to determine if a first condition is satisfied or a second condition is satisfied.

4. The memory device of claim 3, wherein the first subset of one or more memory planes that passed programming are identified in response to determining the failed programming count satisfies the first condition; and wherein the second subset of one or more memory planes that failed programming are identified in response to determining the failed programming count satisfies the second condition.

5. The memory device of claim 1, wherein the trim set is selected from a set of predefined trim sets.

6. The memory device of claim 1, the operations further comprising updating a register value to mark the second subset of one or more memory planes as a lagging plane.

7. The memory device of claim 1, wherein terminating the programming operation with respect to the first subset of one or more memory planes comprises preventing application of voltage to one or more wordlines associated with the first subset of one or more memory planes.

8. The memory device of claim 1, wherein the trim set comprises one or more of a relaxed program loop limit setting, a maximum program voltage setting, a program pulse width setting, a program verify criteria setting, or a selective slow program convergence setting.

9. A memory device comprising:
   a set of memory planes comprising a set of memory blocks; and
   control logic, operatively coupled with the set of memory planes, to perform operations comprising:
   initiating a multi-plane programming operation to program the set of memory blocks of the set of memory planes to a set of programming levels;
   performing a program verify operation associated with a last programming level of the set of programming levels;
   determining that a portion of a first memory block of the set of memory blocks pass the program verify operation;
   causing a set of programming pulses to be applied to the set of memory blocks;
   identifying a first subset of memory blocks that passed the program verify operation associated with the last programming level; and
   terminating execution of the multi-plane programming operation on the first subset of memory blocks.

10. The memory device of claim 9, the operations further comprising:
    identifying a second subset of memory blocks that failed the program verify operation associated with the last programming level.

11. The memory device of claim 10, the operations further comprising:
    selecting a trim set from a set of trim sets; and
    causing the trim set to be applied to the second subset of memory blocks.

12. The memory device of claim 9, the operations further comprising:
    determining a first count of memory bits of a first memory plane that failed programming; and
    comparing the first count to a threshold level to determine a first condition is satisfied, wherein the first condition indicates that the first memory plane passed programming associated with the last programming level.

13. The memory device of claim 12, the operations further comprising:
    determining a second count of memory bits of a second memory plane that failed programming associated with the last programming level; and
    comparing the second count to the threshold level to determine a second condition is satisfied, wherein the second condition indicates that the second memory plane failed programming associated with the last programming level.

14. A method comprising:
executing a programming operation to program a set of memory blocks of a set of memory planes to a set of programming levels;
in response to determining at least a portion of a first memory block passed a program verify operation associated with a last programming level of the set of programming levels, executing a first program sub-operation to terminate the programming operation with respect to a first subset of one or more memory planes of the set of memory planes that passed the program verify operation associated with the last programming level and identify a second subset of one or more memory planes that failed the program verify operation associated with the last programming level; and
executing a second program sub-operation to apply a trim set to the second subset of one or more memory planes that failed the program verify operation associated with the last programming level.

15. The method of claim 14, wherein the first program sub-operation comprises causing a set of programming pulses to be applied to the set of memory blocks.

16. The method of claim 15, wherein following application of the set of programming pulses, further comprising comparing a failed programming count corresponding to the last programming level for each of the memory planes of the set of memory planes to a threshold level to determine if a first condition is satisfied or a second condition is satisfied.

17. The method of claim 16, wherein the first subset of one or more memory planes that passed the program verify operation associated with the last programming level are identified in response to determining the failed programming count satisfies the first condition; and wherein the second subset of one or more memory planes that failed the program verify operation associated with the last program level are identified in response to determining the failed programming count satisfies the second condition.

18. The method of claim 14, wherein the trim set is selected from a set of predefined trim sets.

19. The method of claim 14, further comprising updating a register value to mark the second subset of one or more memory planes as a lagging plane.

20. The method of claim 14, wherein terminating the programming operation with respect to the first subset of one or more memory planes comprises preventing application of voltage to one or more wordlines associated with the first subset of one or more memory planes.

* * * * *